(12) United States Patent
Dawley

(10) Patent No.: US 11,018,381 B2
(45) Date of Patent: May 25, 2021

(54) BATTERY MODULE WITH INTERCONNECT BOARD ASSEMBLY HAVING INTEGRATED CELL SENSE PCB-FLEX CIRCUIT HARDWARE

(71) Applicant: GM Global Technology Operations LLC, Detroit, MI (US)

(72) Inventor: Evan J. Dawley, Bloomfield Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 291 days.

(21) Appl. No.: 16/285,947

(22) Filed: Feb. 26, 2019

(65) Prior Publication Data

US 2020/0274204 A1    Aug. 27, 2020

(51) Int. Cl.
*H01M 10/42* (2006.01)
*H01M 2/20* (2006.01)
*H05K 1/14* (2006.01)
*H01M 50/502* (2021.01)

(52) U.S. Cl.
CPC ....... *H01M 10/425* (2013.01); *H01M 50/502* (2021.01); *H05K 1/147* (2013.01); *H01M 2010/4271* (2013.01); *H05K 2201/10037* (2013.01); *H05K 2201/10272* (2013.01)

(58) Field of Classification Search
CPC combination set(s) only.
See application file for complete search history.

(56) References Cited

U.S. PATENT DOCUMENTS

| | | | |
|---|---|---|---|
| 9,263,722 B2 * | 2/2016 | Ikeda | H01R 11/288 |
| 2006/0252310 A1 * | 11/2006 | Yamada | H01R 12/598 |
| | | | 439/579 |
| 2010/0143788 A1 * | 6/2010 | Koh | H01M 10/42 |
| | | | 429/163 |
| 2010/0198142 A1 * | 8/2010 | Sloan | A61B 5/4839 |
| | | | 604/66 |
| 2015/0072193 A1 | 3/2015 | Balk et al. | |
| 2017/0118838 A1 | 4/2017 | Williams et al. | |
| 2018/0076491 A1 * | 3/2018 | Shoji | G01R 31/396 |
| 2018/0175358 A1 * | 6/2018 | Lin | H01M 50/20 |
| 2018/0198110 A1 | 7/2018 | Zeng | |
| 2018/0248167 A1 * | 8/2018 | Hashizawa | H01M 50/502 |
| 2019/0123334 A1 * | 4/2019 | Kataoka | H01M 50/502 |
| 2020/0091494 A1 * | 3/2020 | Fernandez-Galindo | |
| | | | H01M 10/482 |

* cited by examiner

*Primary Examiner* — Kaity V Chandler
(74) *Attorney, Agent, or Firm* — Quinn IP Law

(57) ABSTRACT

An interconnect board (ICB) assembly is used with a battery module and a battery controller. The ICB assembly includes a printed circuit board assembly (PCBA) integrally formed from a printed circuit board (PCB) and a flex circuit. The PCB has a component surface populated with electronic components which measure and report parameters of the battery module to the battery controller. The flex circuit is constructed of conductive foil, and defines tabular flying leads that project from a periphery of the flex circuit. A window may be present in the flex circuit. A carrier frame has a support surface flanked by busbars. The PCBA is seated on the support surface, with the flying leads conductively joined to a corresponding busbar. A battery system includes the battery controller and the ICB assembly.

20 Claims, 9 Drawing Sheets

BATTERY MODULE WITH INTERCONNECT BOARD ASSEMBLY HAVING INTEGRATED CELL SENSE PCB-FLEX CIRCUIT HARDWARE

The present disclosure generally pertains to electrochemical batteries, associated battery sensing and monitoring circuitry, and methods of manufacturing such batteries. Battery packs constructed from one or more battery modules are often used as direct current (DC) power supplies, e.g., in vehicle powertrains, powerplants, and as key components of other mobile and stationary systems. Electrical energy stored within interconnected battery cells of the battery modules is directed as needed within the system, such as to energize the phase windings of a polyphase electric machine or to directly power a DC device.

A polyphase/alternating current (AC) electric machine typically includes a stator disposed with respect to a rotor. When the AC electric machine is configured as an AC motor, a polyphase voltage is applied to the stator's conductive windings to generate an alternating electromagnetic field around the stator. The resulting field interaction between the stator field and the rotor's magnetic field generates torque on the rotor, which may be directly or indirectly transmitted to a coupled load, e.g., via an intervening gear arrangement. Likewise, an electric generator driven by mechanical rotation in the system may generate and direct electricity back into the individual battery cells to thereby recharge the battery pack. Charging and discharging currents, individual cell voltages, states of charge, battery temperatures, and other relevant battery parameters may be closely monitored and regulated in real-time by an electronic battery controller in the above-described system and other systems so as to optimize the performance and operating life of the battery pack.

SUMMARY

A battery system as disclosed herein includes a battery module and a battery controller in communication therewith, with the battery controller referred to herein as a Battery System Manager (BSM). The BSM monitors and controls the flow of electrical energy to and from individual battery cells of the battery module, monitors the battery module's ongoing state of health, and possibly provides other battery control functions. For instance, the BSM may periodically initiate cell balancing functions and/or thermal regulation operations, with these and other functions facilitated by the present teachings.

In particular, the battery module described herein includes an interconnect board assembly ("ICB assembly") having a carrier frame and a printed circuit board assembly ("PCBA"), the latter of which is mounted to the carrier frame. The PCBA is integrally constructed of two main components, i.e., a cell sense printed circuit board ("PCB") and a thin, flexible printed circuit ("flex circuit"). The flex circuit serves as a substrate surface for the PCB in a manner as set forth herein. In another manner, the PCB serves as the substrate surface on which the flex circuit is placed. The ICB assembly includes conductive bus bars, e.g., alternating copper and aluminum busbars in a possible embodiment, or busbars constructed of the same material, e.g., aluminum, copper, bimetal, or a combination thereof. A respective surface of each busbar is conductively joined to the flex circuit, while the busbar also conductively contacts and/or is conductively joined to a corresponding electrode terminal of a given battery cell. The ICB assembly, directly and/or via the PCB, may communicate with the above-noted BSM over a wireless/radio frequency (RF) link and/or by transmitting signals over a hardwired set of transfer conductors.

The PCB and the flex circuit are integrally formed as a unitary component. One approach for ensuring the requisite integration of the PCB and flex circuit is the use of a reflow surface-mounted technology (SMT) soldering process. The reflow process may be selective in nature, e.g., through local application of heat, as in an example "hot bar" soldering. Alternatively, the reflow process may be global in nature, such as through the use of an SMT oven. The PCB, which may be constructed of semiconductor substrate materials such as fiberglass-reinforced epoxy resin or FR-4, ultimately provides structural rigidity and the various conductive interfaces necessary for supporting a population of electronic components in the form of cell monitoring chips, sensors, capacitors, resistors, transceivers, heat sinks, etc. Such electronic components are mounted to a component surface of the PCB on one or both opposing major surfaces of the PCB. That is, the PCB may be one-sided or two-sided in alternative embodiments, with various approaches disclosed herein for implementing both configurations.

The flex circuit of the PCBA is situated on and integrally joined to the PCB, with the particular major surface of the PCB that is immediately adjacent to the flex circuit referred to herein as the "flex interface surface." As part of the presently disclosed circuit construction, the flex circuit defines radially-extending tabs ("flying leads") that are distributed around lateral edges of the flex circuit's periphery. The individual flying leads are conductively joined to a respective one of the busbars. The busbars themselves are placed in conductive contact with, and possibly welded to, the electrode terminals of the individual battery cells to complete an electrical circuit.

The flex circuit described herein is constructed of thin foil coated in an insulating layer. The term "thin foil" as used herein may encompass a substantially flat or planar layer of a conductive material, such as elemental metal, having a uniform thickness of about 0.2 millimeters (mm) or less. Example metals include aluminum, copper, nickel, tin, etc. The insulating layer is constructed of a dielectric material, such as polyethylene naphthalate (PEN), polyethylene terephthalate (PET), or polyimide (PI). An adhesive binder may be used in some embodiments to help adhere the foil material to the insulating layer. Use of the insulating layer electrically insulates the foil material, with the exception of terminal ends of the flying leads or other designated portions of the flex circuit that are ultimately joined to the busbars of the ICB assembly or to the PCB board.

Discrete local pads or landings are defined by an opening in the insulation layer of the flex circuit, possibly in conjunction with optional plating material suitable to the application. To facilitate joining of the various components, the discrete landings may be constructed of a different conductive material than that which is used to form the flex circuit. For example, copper landings may be used in conjunction with aluminum as the foil substrate in some embodiments. The landings may be optionally deposited or plated onto an otherwise aluminum junction between the respective flying leads and a major surface of the flex circuit. For instance, if the major surface of the flex circuit is rectangular in plan view, i.e., having two parallel elongated side edges and two parallel end edges, the flying leads may extend radially-outward from the elongated side edges. The copper landings in this instance may be provided on a junction between the flying leads and the major surface of the flex circuit. Such landings may facilitate the above-noted reflow SMT soldering process. Alternatives to local deposition or plating-based formation of the landings are disclosed herein.

In some configurations, the major surface of the flex circuit may define a window, i.e., an opening formed or cut entirely through the thickness of the flex circuit. In such an embodiment, some or all of the electronic components populating the PCB may protrude at least partially through the window, with the component surface and the flex interface surface of the PCB possibly being the same surface. Such a window may help reduce required packaging space and/or the amount of material needed to construct the flex circuit, as well as further reduce manufacturing time.

As disclosed above, the ICB assembly includes a carrier frame, e.g., a molded, tray-like plastic carrier frame. The carrier frame includes the above-noted busbars, as well as end terminals and possibly cell monitoring electronics and/or other electronic interfaces. In a wireless embodiment, for instance, the carrier frame may support a radio frequency (RF) communications chip, or such a chip may be present on the PCBA. The PCBA may be positioned on the carrier frame, e.g., on a landing surface thereof, such that the flying tabs located around the periphery of the flex circuit properly align with the busbars. The number of flying leads is dependent upon the particular construction and use of the battery module, e.g., the number of battery cells/cell groups used in the battery module, the series or parallel connections of such cells/cell groups, etc.

The above summary is not intended to represent every embodiment or aspect of the present disclosure. Rather, the foregoing summary exemplifies some of the novel aspects and features set forth herein. The above-noted and other features and advantages of the present disclosure will be readily apparent from the following detailed description of representative embodiments and modes for carrying out the present disclosure when taken in connection with the accompanying drawings and the appended claims.

Figure 1:
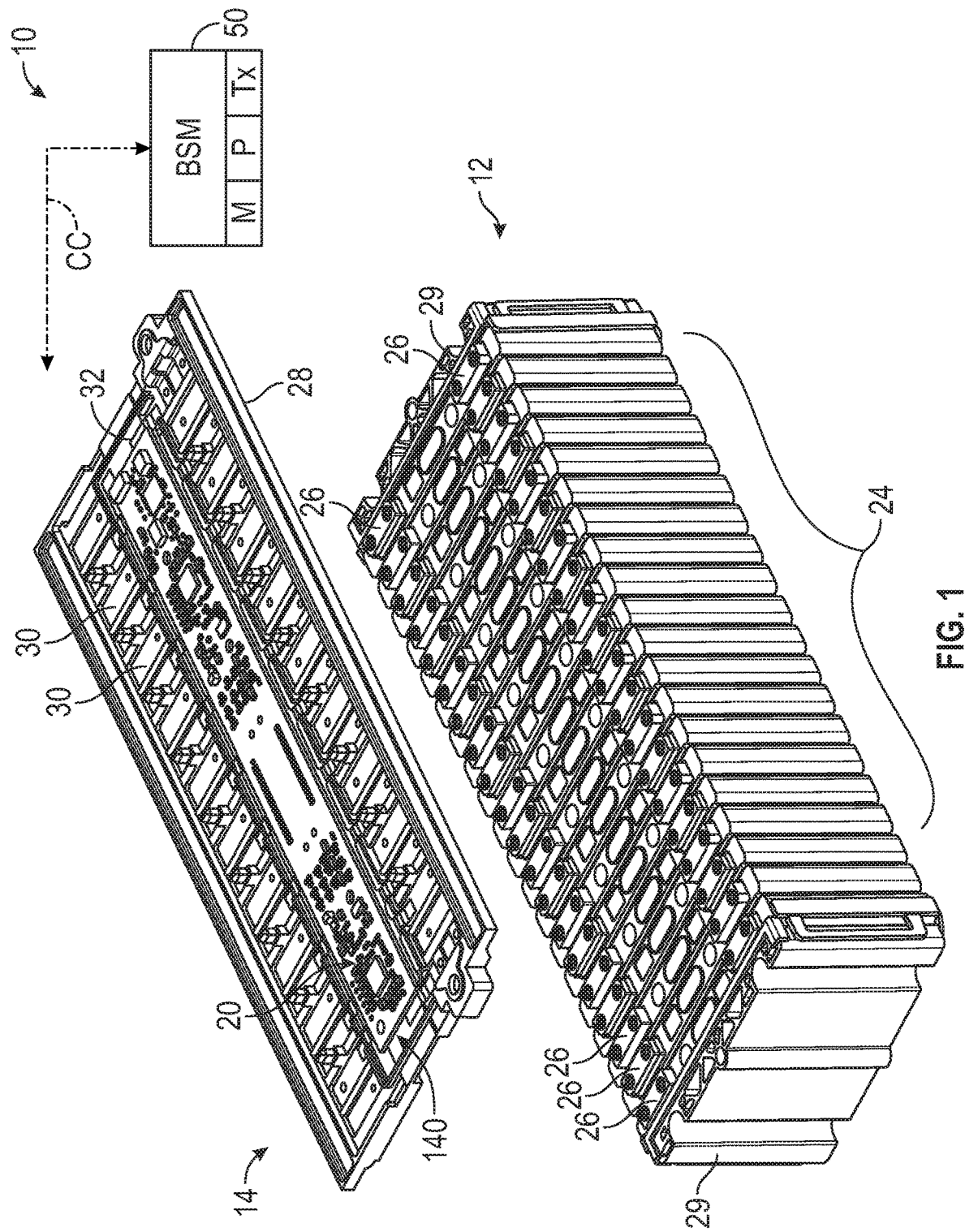
FIG. 1 is a partially-exploded perspective view illustration of a battery system according to an embodiment, with the battery system including a battery controller and a battery module having an interconnect board assembly ("ICB assembly") constructed of an integrally-formed printed circuit board ("PCB") and flexible printed circuit ("flex circuit") as described in detail herein.

The present disclosure may have various modifications and alternative forms, and some representative embodiments are shown by way of example in the drawings and will be described in detail herein. Novel aspects of this disclosure are not limited to the particular forms illustrated in the above-enumerated drawings. Rather, the disclosure is to cover modifications, equivalents, and combinations falling within the scope of the disclosure as encompassed by the appended claims.

DETAILED DESCRIPTION

As used herein with respect to disclosed values or ranges, the term "about" indicates that the stated numerical value allows for slight imprecision, e.g., reasonably close to the value or nearly, such as ±10 percent of the stated values or ranges. If the imprecision provided by the term "about" is not otherwise understood in the art with this ordinary meaning, then "about" as used herein indicates at least variations that may arise from ordinary methods of measuring and using such parameters. In addition, disclosure of ranges includes values and further-divided ranges within the entire range.

Referring to the drawings, wherein like reference numerals are used to identify like or identical components in the various views, a battery system 10 is shown in FIG. 1. The battery system 10 may include a battery module 12 and a master battery controller, with such a controller referred to hereinafter as a battery system manager (BSM) 50. The BSM 50 communicates with the battery module 12 via an interconnect board assembly ("ICB assembly") 14 of the battery module 12, as indicated by a double-headed arrow CC. The two-way communication may occur over hard-wired transfer conductors and/or wirelessly over a suitable radio frequency (RF)-based link and communications protocol.

Figure 5:
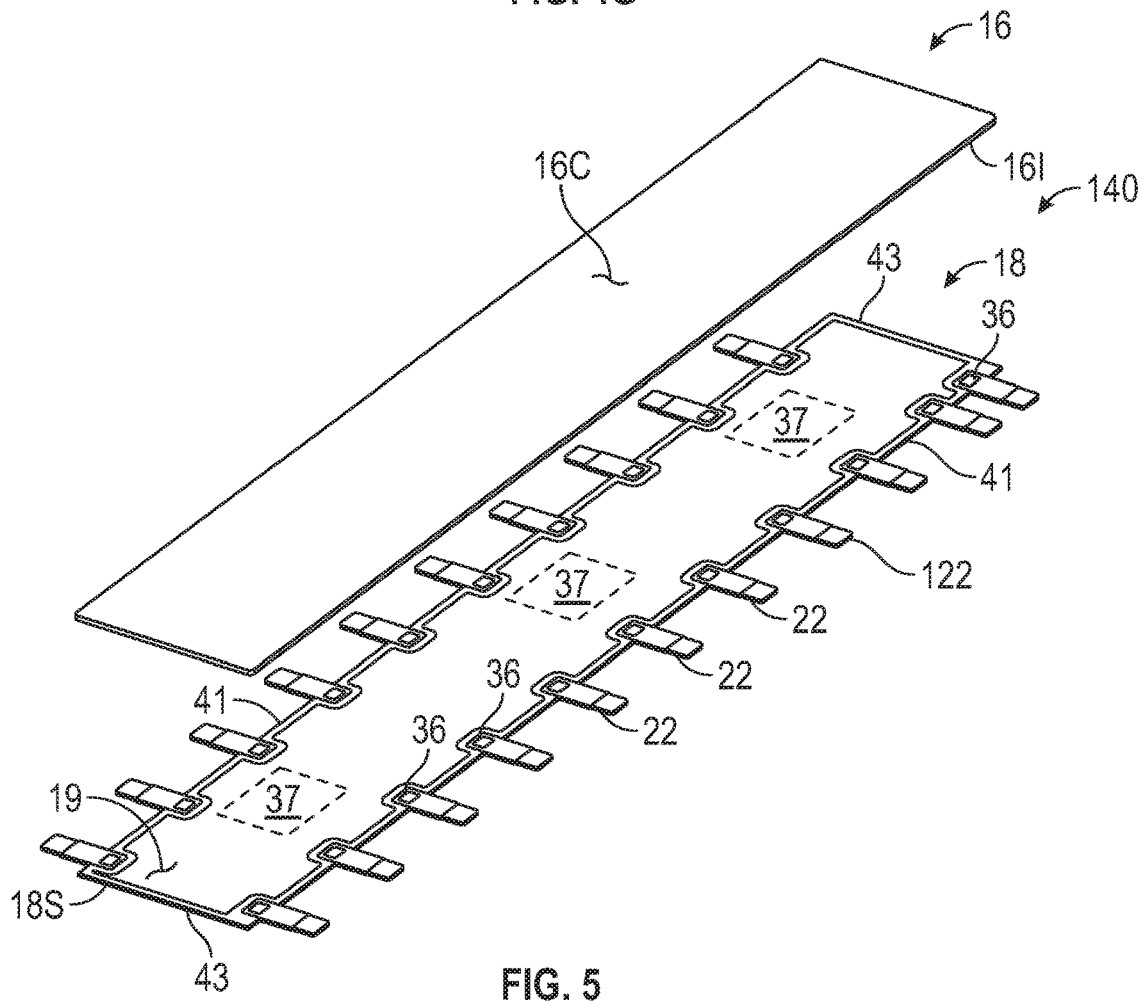
FIGS. 5-7 are schematic perspective exploded-view illustrations of alternative configurations of the PCBA shown in FIG. 2.

In general, and as best shown in FIG. 5, the ICB assembly 14 of FIG. 1 includes a printed circuit board assembly ("PCBA") 140, the integral components of which include a printed circuit board ("PCB") 16 and a flexible printed circuit ("flex-circuit") (FLX) 18. The PCB 16 and flex circuit 18 are integrally formed or constructed, such as by using a reflow surface-mounted technology (SMT)-based soldering process or other suitable fabrication process as set forth herein. When the ICB assembly 14 of FIG. 1 is configured as described herein, manufacturing of the ICB assembly 14, and therefore the battery module 12, may be streamlined relative to alternative processes so as to reduce the number and order of manufacturing process steps needed for joining the cell-monitoring PCB 16 to the flex circuit 18.

Figure 2:
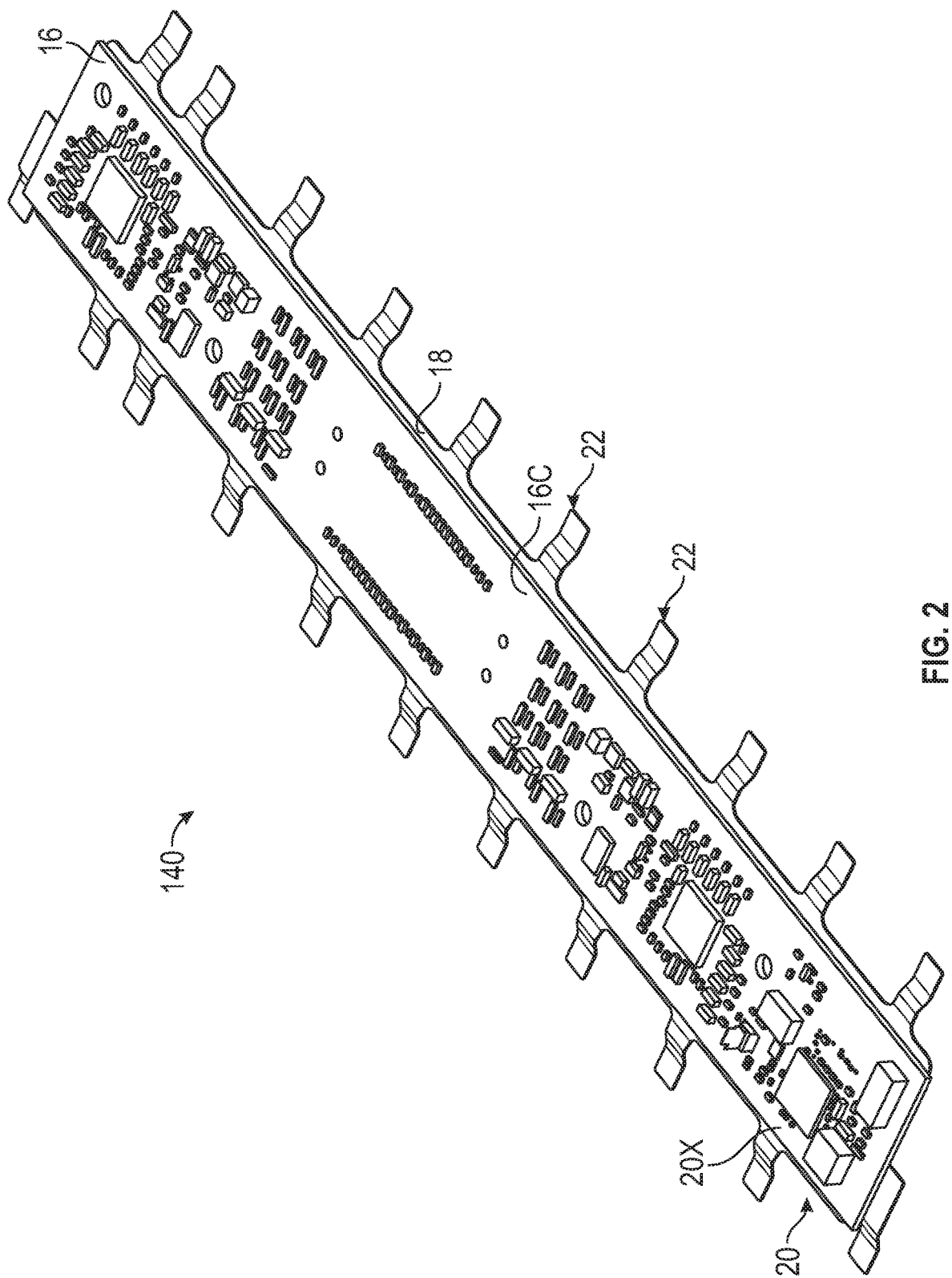
FIG. 2 is a schematic perspective view illustration of an embodiment of a printed circuit board assembly ("PCBA") that may be used as part of the ICB assembly shown in FIG. 1.

Further with respect to the BSM 50 of FIG. 1, this electronic battery control device or a network of such devices may include one or more digital computers each one having a processor (P) and sufficient amounts and types of memory (M), e.g., read only memory, random access memory, and electrically-erasable programmable read only memory. As noted above, the BSM 50 may be optionally placed in wireless communication with the ICB assembly 14. In such an embodiment, the BSM 50 may include an RF transceiver (Tx) configured to receive wireless signals from the ICB assembly 14, e.g., a corresponding RF transmitter 20X thereof as shown in FIG. 2, to enable the two-way communications indicated by double-headed arrow CC. Example battery parameters that may be wirelessly communicated to and/or from the BSM 50 include cell voltages, temperatures, thermal regulation and/or cell balancing control signals, and other application-specific values, as well as control signals from the BSM 50 that command a particular change of state of the battery module 12, e.g., during a cell charge balancing process. The BSM 50 may execute software programs using the processor (P) in the overall operational control of the battery module 12 and/or a battery pack (not shown) within which the battery module 12 is used.

In a possible embodiment, an RF communications circuit of the BSM 50 using the above-noted RF transceiver (Tx) may employ a 2.4 GHz protocol over a secure wireless network, such that battery data is transmitted using low-power radio waves. As will be appreciated, 2.4 GHz protocols generally encompass a frequency range of about 2.402-2.480 GHz. Other RF frequency ranges, including emerging 5 GHz protocols or earlier protocols operating in the sub-1 GHz spectrum, may be used within the scope of the present disclosure.

FIG. 2 is perspective view illustration of the PCBA 140 noted above with reference to FIG. 5, and shows the PCB 16 after being integrally joined to the flex circuit 18. The PCB 16 has at least one component surface 16C, e.g., an upper surface as viewed from the perspective of FIG. 2 and/or a lower surface, and cell sense and monitoring electronic components 20 mounted to the component surface(s) 16C. As will be appreciated by those of ordinary skill in the art, the various electronic components 20 may include application-specific integrated circuits (ASICs), memory chips, resistors, capacitors, diodes, etc. One or more of the electronic components 20 may be configured as the RF transceiver component 20X so as to enable the PCBA 140/ICB assembly 14 to communicate wirelessly with the RF transceiver (Tx) of the BSM 50 as depicted in FIG. 1. The illustrated configuration and placement of the electronic components 20 in FIG. 2 is non-limiting, and may vary depending on the application of the PCBA 140 and battery module 12.

The flex circuit 18 depicted in FIG. 2 defines a plurality of radial tabs which are spaced around its periphery. Such radial tabs, which are referred to hereinafter and in the general art as "flying leads" 22, extend radially-outward from the periphery of the flex circuit 18, and may be evenly or unevenly spaced or distributed depending on the embodiment. The flying leads 22 are ultimately conductively joined to the battery cells 24 of FIG. 1 via a corresponding busbar 30, e.g., via laser welding, ultrasonic welding, or resistance welding, as shown in FIG. 1.

The PCB 16 of FIG. 2 may be populated with the electronic components 20, e.g., using a pick-and-place process, and positioned with respect to the flex circuit 18. The adjacent PCB 16 and flex circuit 18 may be subjected to the above-noted reflow SMT soldering process, with optional variations thereof described below with reference to FIGS. 11A-11D, so as to integrally and permanently join the PCB 16 and flex circuit 18 into the unitary PCBA 140. The electronic components 20 collectively monitor and report the present state of the battery module 12 to the BSM 50 of FIG. 1 and/or to other electronic control units depending on the intended application of the battery system 10, with electrical and communications connectivity to the battery cells 24 of FIG. 1 facilitated by the integral connection of the PCB 16 to the flex circuit 18.

Figure 10:
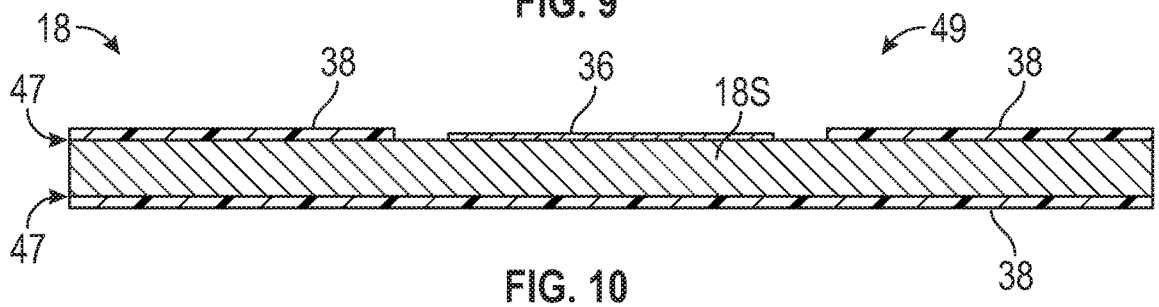
FIG. 10 is a schematic cross-section illustration of a portion of the flex circuit usable as part of the PCBA shown in FIG. 2.

Referring briefly to FIG. 10, the flex circuit 18 is shown in schematic cross-sectional view in proximity to a discrete solder pad or landing 36. The solder landing 36 is exposed through an opening or gap in the insulating materials of the substrate 18S, as will be described below with reference to FIG. 5. The flex circuit 18 is configured to transfer measured voltage and/or temperature signals from individual cell electrode terminals 26 of the battery cells 24, both shown in FIG. 1. The flex circuit 18 in its various embodiments is constructed of a thin substrate 18S of conductive material, e.g., metal foil.

The term "thin" is in relation to a corresponding thickness of the PCB 16, and therefore may vary with the application, but in general is less than about 0.2 mm. The substrate 18S may be coated with an electrically-insulating layer 38, e.g., polyethylene naphthalate (PEN), polyethylene terephthalate (PET), polyimide (PI), etc. An adhesive binder layer 47 such as epoxy may be used to adhere the substrate 18S to the insulating layer 38, or the insulating layer 38 may be self-adhering. Alternatives may be envisioned. For instance, in lieu of the discrete solder lands 36 as shown in FIG. 10, one or both major surfaces of the substrate 18S may be deposited or plated with material, e.g., copper and/or nickel when the substrate 18S is aluminum, with the insulation gaps 49 exposing a designed area of the conductive material to define the discrete lands 36.

The primary material used to construct the substrate 18S may be aluminum in some embodiments, without limiting the construction to such a material. If copper is used for the substrate 18S, for instance, a material other than copper may be deposited or plated onto the copper substrate 18S as the solder lands 36 to enhance soldering. As disclosed above, the deposition/plating process may be performed globally on the entirety of the substrate 18S, and thus need not be locally applied. In any case, the boundaries of the solder lands 36 coincide with the boundaries of the insulation gaps 49, through which the solder material is reflowed during an SMT soldering process.

Referring briefly to FIGS. 11A-11D, one or two surfaces of the PCB 16 may be used as component surfaces 16C in different embodiments. Additionally, a flex interface surface 161 is defined herein as being the particular surface of the PCB 16 that is integrally joined to the flex circuit 18. That is, the term "interfacing" refers to immediately-adjacent and abutting surfaces of the PCB 16 and flex circuit 18, which may or may not also be a component surface 16C.

Figure 11A:
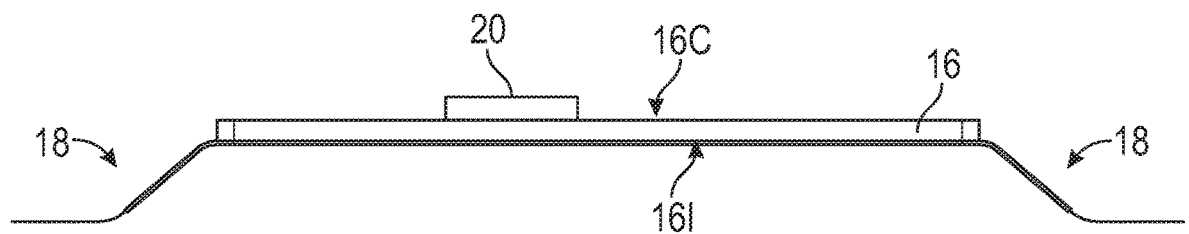
FIGS. 11A-D are schematic side view illustrations of various PCB-flex circuit configurations for use in the PCBA shown in FIG. 2.
Figure 11B:
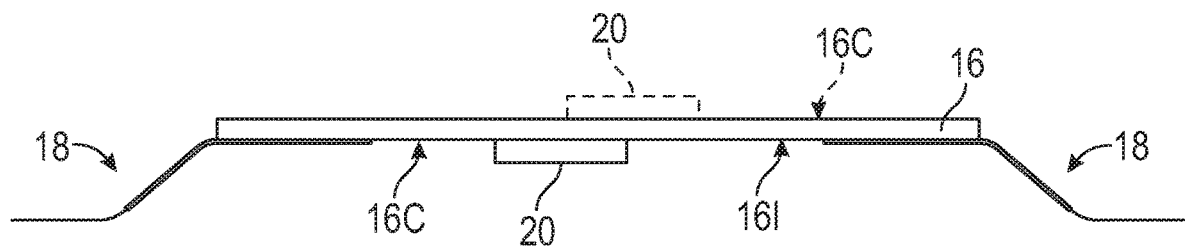
Figure 11C:
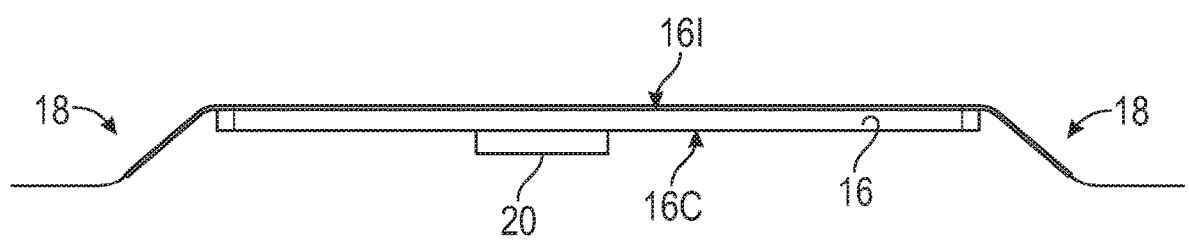

For instance, FIG. 11A shows an example embodiment in which the component surface 16C populated with an example electronic component 20 is located diametrically opposite to the flex interface surface 161. By comparison, FIG. 11B shows a component surface 16C and a flex interface surface 161 located on the same side of the PCB 16. Optionally, another component surface 16C may be diametrically-opposite the flex interface surface 161 in a possible two-sided population of the PCB 16. FIG. 11C essentially flips the configuration of FIG. 11A, such that the component surface 16C and the example electronic component 20 are diametrically opposite the flex interface surface 161, with the flex circuit 18 situated above the PCB 16 from the perspective of FIG. 11C and below the PCB 16 from the perspective of FIG. 11A. A window 45 in the flex circuit 18, described below with reference to FIGS. 6 and 7, may be used in the example configurations of FIGS. 11B and 11D to allow the electronic component(s) 20 to protrude at least partially through the window 45, e.g., to enable certain packaging options.

Referring once again to FIG. 1, the battery module 12 includes the battery cells 24 previously noted above. The battery cells 24 may be enclosed in or surrounded by a protective housing, two endplates 29 of which are visible in FIG. 1 and two lateral/side plates of which are omitted for illustrative clarity. Also omitted is a battery cover spanning the battery module 12 and thereby preventing dirt, moisture, and debris from contacting the ICB assembly 14 and/or the battery cells 24. The battery module 12 may include an application-suitable number of such battery cells 24, such as twenty battery cells 24 in the illustrated example embodiment, or more or fewer battery cells 24 in other embodiments. While one battery module 12 is shown in FIG. 1 for illustrative simplicity, several battery modules 12 may be interconnected to form a battery pack having an application-suitable voltage level, as will be appreciated by those of ordinary skill in the art.

Each constituent battery cell 24 of the battery module 12 shown in FIG. 1 includes corresponding cell electrode terminals 26 having alternating positive and negative polarities. While "can-style" battery cells 24 are depicted, other embodiments of the battery cells 24 may be used within the scope of the disclosure, including but not limited to foil pouch-style battery cells having protruding foil tab extensions or other types of battery cells.

The ICB assembly 14 includes a carrier frame 28, which in turn may be optionally embodied as a generally flat, rectangular tray structure constructed of heat-resistant molded plastic. Alternatively, the carrier frame 28 may be constructed of an insulated metal and/or a dielectric material configured to support and expose the conductive busbars 30 around the peripheral edges of the carrier frame as shown. The busbars 30 may be constructed of aluminum in an embodiment, which facilitates laser welding of the flying leads 22 when the flying leads 22 are likewise constructed of aluminum. In other configurations, the busbars 30 and flying leads 22 may be constructed of materials other than aluminum, e.g., copper. Dissimilar materials may be used in other embodiments, such as aluminum busbars 30 and copper flying leads 22, or vice versa. Flying leads 22 with a surface treatment may be constructed in the same manner as the solder landings to facilitate attachment to the busbars 30, e.g., aluminum flying leads 22 may have copper disposed on the surface(s) to facilitate conductively joining or welding to copper busbars 30.

The carrier frame 28 shown in FIG. 1 may include a support surface 32 on which the PCBA 140 is disposed, with the support surface 32 flanked by the busbars 30 in the illustrated embodiment. When the PCBA 140 is shaped as an elongated rectangle, for instance, the support surface 32 may have a complementary elongated rectangular shape. Other shapes of the PCBA 140 and the support surface 32 may be used within the scope of the disclosure, e.g., square, oval, irregular, etc., but would typically have complementary/matching shapes so that the PCBA 140, once seated, rests or nests securely on and/or within the support surface 32.

The ICB assembly 14 may be fastened or otherwise securely joined to the battery module 12, e.g., using lugs, screws, snaps, and/or welding, which forces the cell electrode terminals 26 either into continuous conductive contact with or close proximity to a corresponding busbar 30. The busbars 30 may be conductively joined to the cell electrode terminals 26 using a suitable welding process, e.g., laser welding. The flying leads 22 are conductively joined to the busbars 30 via laser welding, ultrasonic welding, resistance welding, weld bonding, and/or another suitable process, which may occur at the same time or subsequent to when the busbars 30 are joined to the cell electrode terminals 26. Optionally, the flying leads 22 may be attached to the busbars 30 prior to welding the busbars 30 to the cell electrode terminals 26 of the battery cells 24. As another optional embodiment, the flying leads 22 may be attached to the busbars 30 prior to loading the ICB assembly 14 to the battery module 12 of FIG. 1.

Figure 3:
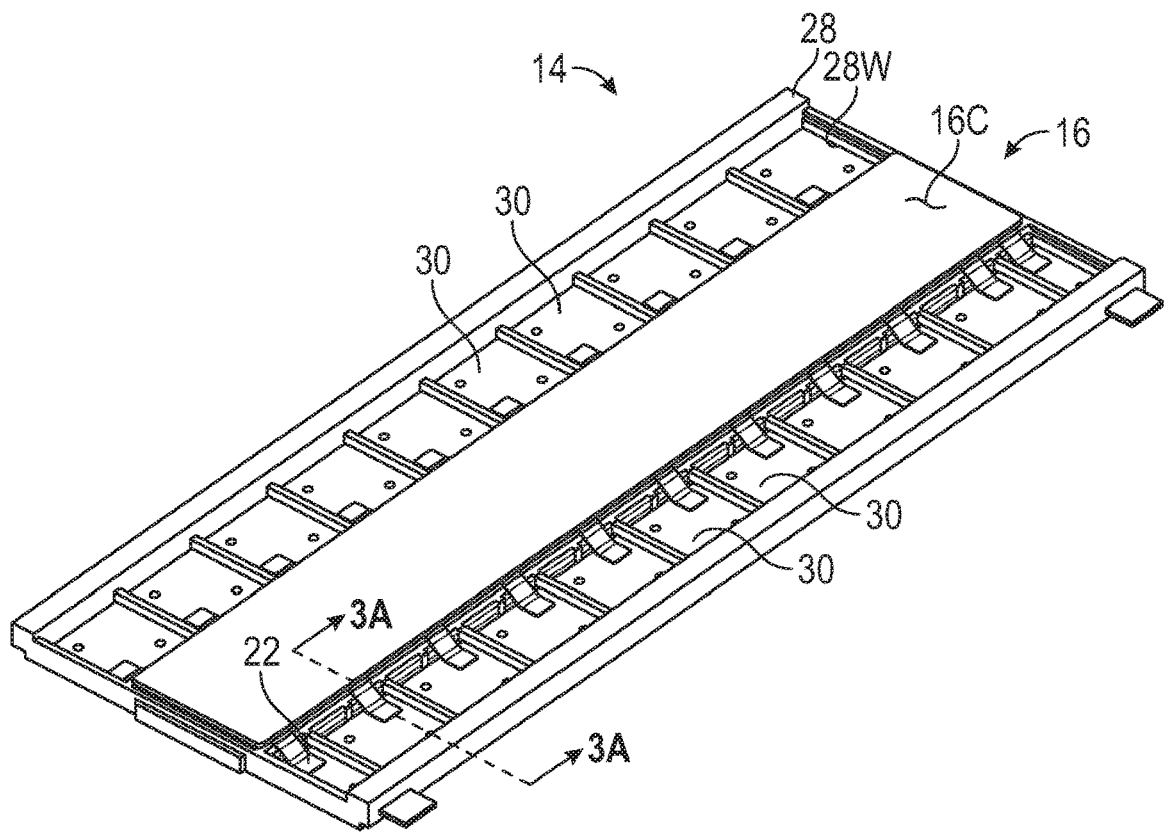
FIG. 3 is a schematic perspective view illustration of an ICB assembly usable as part of the battery module shown in FIG. 1.
Figure 3A:
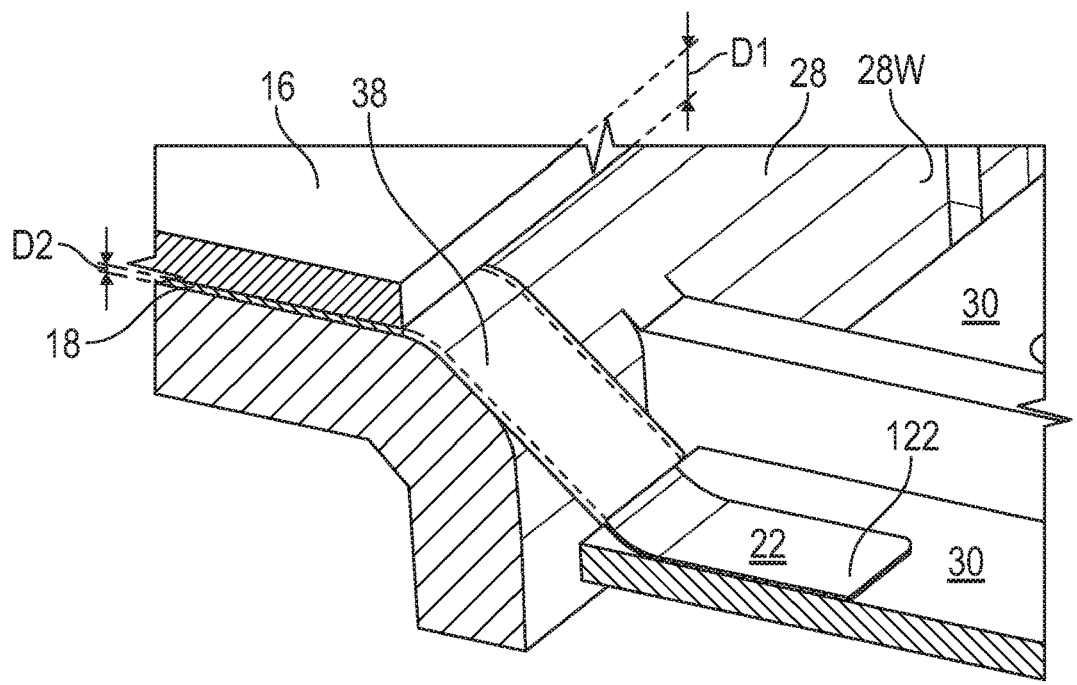
FIG. 3A is a perspective view illustration of a portion of the ICB assembly of FIG. 3 taken along cutline 3A-3A.

FIGS. 3 and 3A show an embodiment of the carrier frame 28 for the ICB assembly 14, which includes and/or supports the above-noted busbars 30, such as by disposing a corresponding one of the busbars 30 in an individual tray window 28W. As best shown in the close-up view of FIG. 3A taken along cutline 3A-3A of FIG. 3, the PCB 16 has a thickness (D1) that substantially exceeds a thickness (D2) of the flex circuit 18. The thickness (D1+D2), minus a height of the electronic components 20 (see FIG. 2), may be about 2 mm in some embodiments, with thickness D2 being on the order of about 0.2 mm or less as noted above.

Unlike the PCB 16, which may be constructed largely of a substantially-rigid substrate of solder-masked fiberglass epoxy resin or other semi-rigid substrate material, the flex circuit 18 contemplated herein is constructed of a thin, flexible foil substrate 18S and insulation material 38, as shown in FIG. 10. An uninsulated terminal end 122 of each respective flying leads 22 may be gently deflected or angled into contact or close proximity with a corresponding busbar 30 and thereafter securely welded into place. One advantage of using a metal foil construction for the flex circuit 18 is the resulting improvement in strain relief, particularly at or along welds joining the flex circuit 18 to the PCB 16. While an uninsulated terminal end 122 is shown in FIG. 3A, it is also possible to extend the insulation material 38 out to the edge of the terminal end 122 and provide an opening in the insulation material 38 large enough to permit welding.

Figure 4:
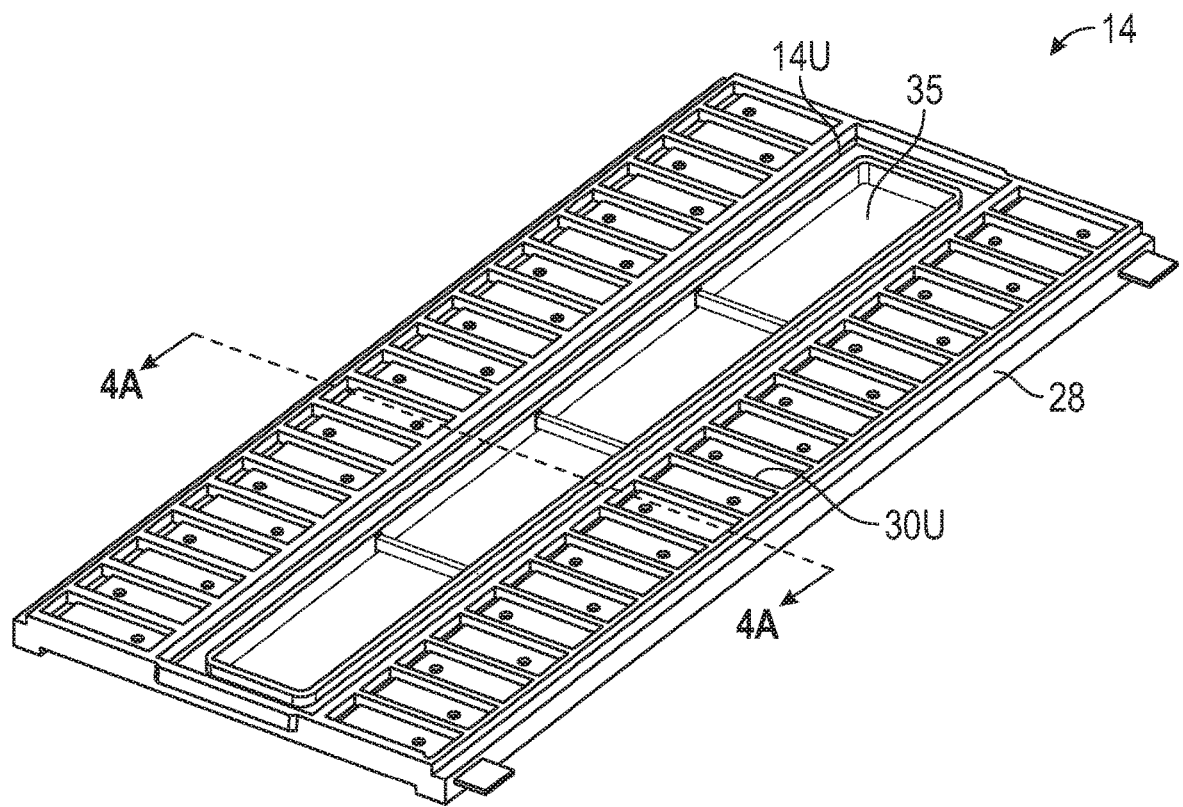
FIG. 4 is a schematic perspective view illustration of an underside of the ICB assembly shown in FIG. 3 subsequent to an optional potting or over-molding process.
Figure 4A:
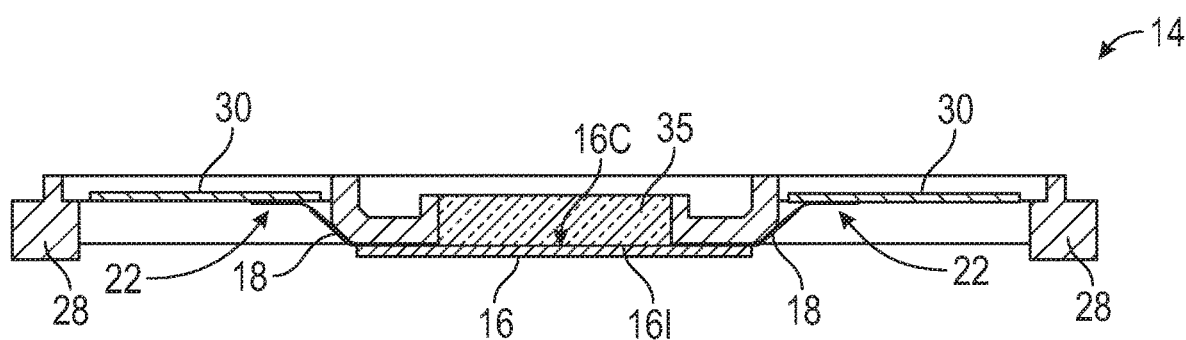
FIG. 4A is a schematic cross-sectional side view illustration of the ICB assembly taken along cutline 4A-4A of FIG. 4.

FIG. 4 shows an underside 14U of the ICB assembly 14. FIG. 4A is taken along cut line 4A-4A of FIG. 4, and corresponds generally to the arrangement depicted in FIG. 11B as described above. Once the PCB 16 is integrally formed with the flex circuit 18 to form the PCBA 140 of FIG. 2, portions of the carrier frame 28 and other components may be coated to a suitable depth by potting material 35. As will be appreciated, potting or over-molding involves covering or encapsulating the electronic components 20 and/or electrical interfaces thereof for increased reliability. Using a low-pressure molding process, designated portions of the PCBA 140 may be encapsulated to seal the desired interfaces. The potting material 35 may be a silicone-based material, epoxy-based resin, polyamide, plastic gel, or a thermosetting, room temperature-curable, or ultraviolet (UV)-curable material in various non-limiting embodiments, with such materials providing added protection and corrosion resistance to coated surfaces. Exposed undersurfaces 30U of the busbars 30 ultimately contact or are conductively joined to the cell electrode terminals 26 of FIG. 1 to complete an electrical circuit during assembly of the battery module 12.

Figure 4B:
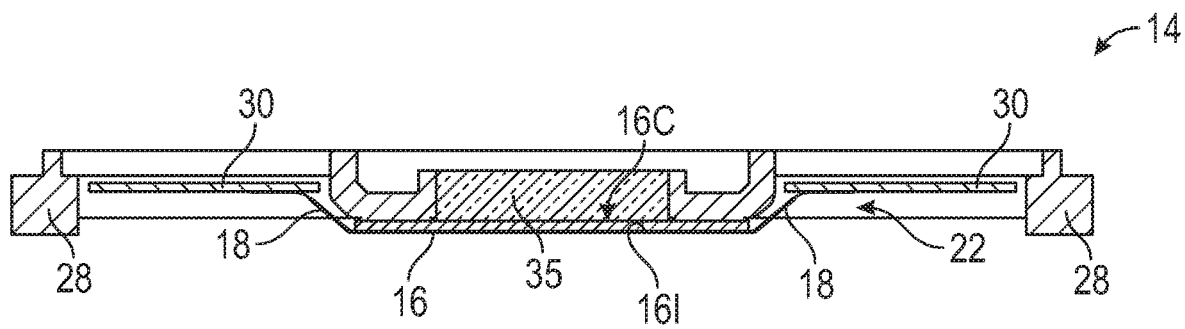
FIGS. 4B-4G are schematic cross-sectional side view illustrations of alternative embodiments of the ICB assembly shown in FIG. 4.
Figure 4C:
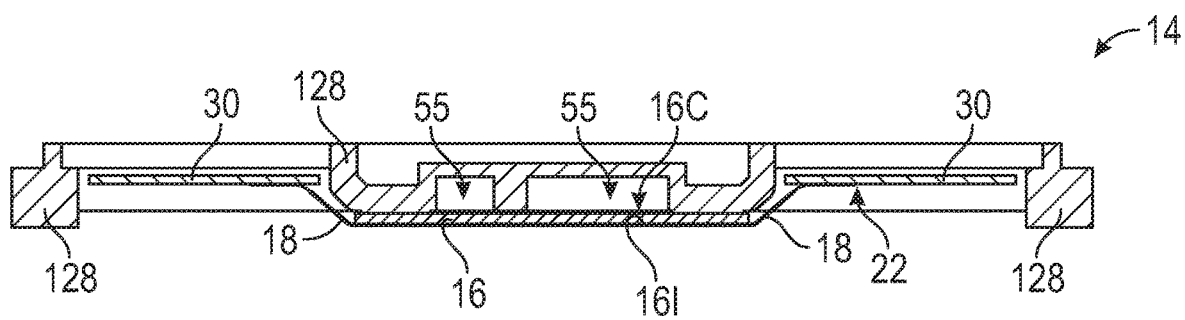
Figure 4D:
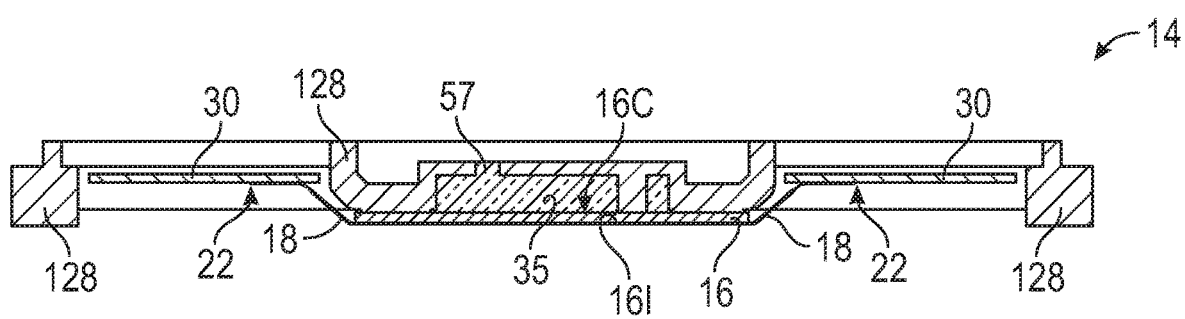
Figure 4E:
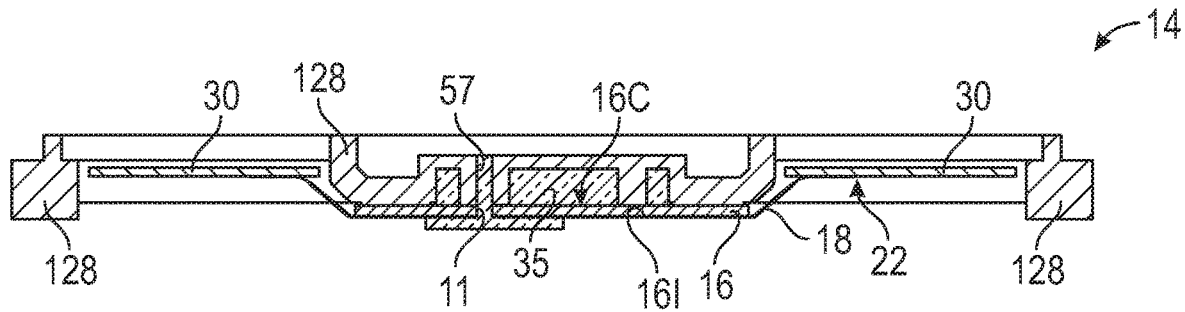

FIGS. 4B-4E show alternative potting or over-molding arrangements usable within the scope of the disclosure. FIGS. 4A and 4B correspond to the relative positioning of the flex circuit 18 and PCB 16 as shown in FIGS. 11C and 11B, respectively. Thus, components 20 of FIG. 2 situated on the single component surface 16C may be encapsulated in the potting material 35. FIGS. 4C and 4D, on the other hand, both show an optional carrier frame 128. In conjunction with the PCB 16, the carrier frame 128 may define cavities 55 that may be empty (FIG. 4C) or filled with the potting or over-molding material 35 (FIG. 4D). To facilitate use of the material 35 in FIG. 4D, the carrier frame 128 may include a fill port 57 through which the material 35 or another suitable over-molding material may be injected into the cavities 55. FIG. 4E shows the embodiment of FIG. 4D, but with the addition of a through-hole 11 in the PCB 16 to allow the material 35 to flow onto the PCB 16, e.g., for extra protection of joints on the flex interface surface 161 or for additional mechanical retention.

Figure 4F:
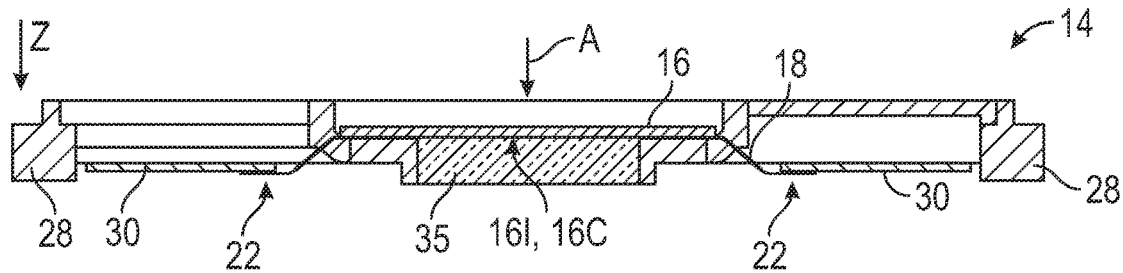

FIG. 4F depicts another embodiment in which the PCB 16 is installed from the bottom of the carrier frame 28, as indicated by arrow A. Arrow Z shows the typical upward Z-direction of a Cartesian coordinate frame of reference, such that a topside of the carrier frame 28 is located at the bottom of FIG. 4F. The PCBA 140 is installed to the carrier frame 28 in the direction of arrow A, with the potting or over-molding material 35 applied from the topside of the carrier frame 28. The embodiments of FIGS. 4C and 4D with cavities 55 may also be constructed in this manner.

Figure 4G:
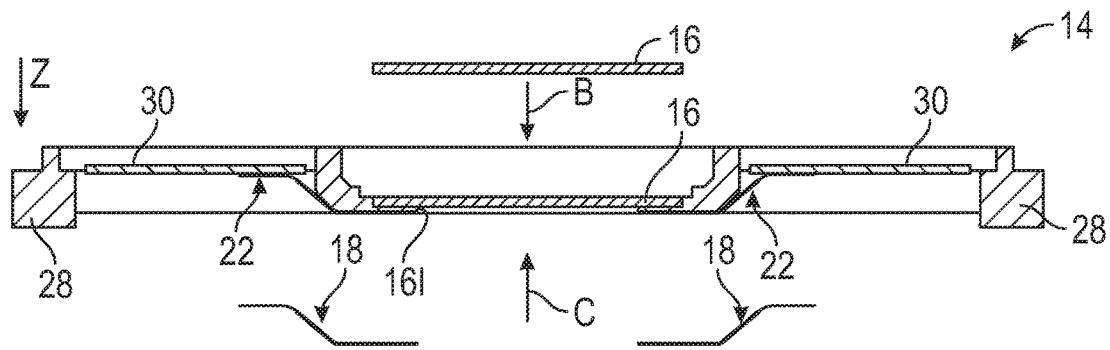
Figure 11D:
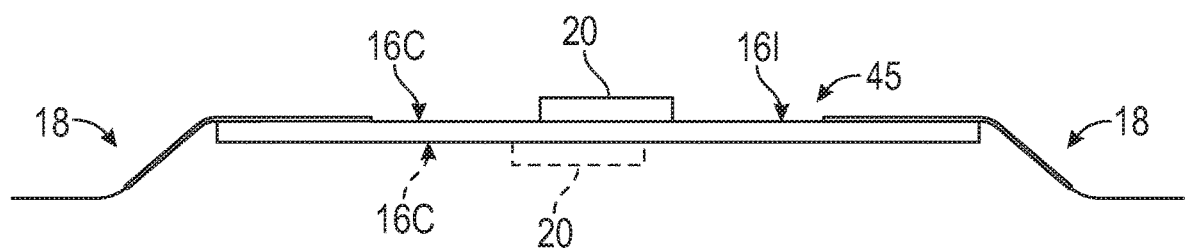

Referring to FIG. 4G, which may be used to construct the arrangements of FIGS. 11C or 11D, the ICB assembly 14 may be optionally constructed from separate pieces. For instance, the PCB 16 may be installed from the underside of the carrier frame 28 as indicated by arrow B. The flex circuit 18 may be installed to the flex interface surface 161, as indicated by arrow C. Thereafter, the entire ICB assembly 14 of FIG. 4G may undergo a reflow SMT process, or the PCB 16 and flex circuit 18 may be selectively soldered or bonded, e.g., using a conductive adhesive material.

Referring to FIG. 5, the PCBA 140 of FIG. 2 is depicted in exploded view to further illustrate certain structural details. The component surface 16C is visible from the perspective of FIG. 5, with the various electronic components 20 of FIG. 2 omitted for illustrative simplicity. For SMT process compatibility, the flex circuit 18 may include the localized/discrete landing surfaces 36 noted above, which may be constructed of a solderable material that is the same as or different from that which is used to construct the substrate 18S of the flex circuit 18, e.g., copper when the substrate 18S is aluminum. The flex circuit 18 may also include one or more adhesive patches 37, e.g., pressure-sensitive adhesive, which are shown schematically as square patches, but which may vary in size and/or location on the flex circuit 18. The use of such adhesive patches 37 may facilitate the temporary retention the PCB 16 and flex circuit 18 prior to undergoing the SMT soldering process.

Further with respect to the discrete solder landings 36, surface treatment material of the solder landings 36 may be deposited onto the flex circuit 18 using a suitable material deposition or plating process, at or just past a corresponding junction between each respective flying lead 22 and a major surface 19 of the flex circuit 18. The major surface 19 is defined herein as the area of the flex circuit 18 that is not coextensive with that of the flying leads 22, i.e., the landings 36 may be located on the major surface 19 immediately adjacent to the flying leads 22. The use of aluminum as the material of construction of the substrate 18S in conjunction with small pads of copper surface treatment as the solder landings 36 may be advantageous relative to approaches that start with a lamination or assembly of copper foil substrate 18S and aluminum flying leads 22 and etch the copper away, e.g., in terms of reduced copper content and associated material and process costs.

The flex circuit 18 is rectangular in the non-limiting example embodiment of FIG. 5, and thus has two facing, parallel elongated side edges 41 and two facing, parallel end edges 43. The flying leads 22 extend radially-outward from the elongated side edges 41. The actual number of flying leads 22 present on a given side edge 41 may differ from the depicted embodiments without changing the dimensions of the major surface 19. Such a feature may facilitate reconfiguration of the PCB 16 for use with different collections of components 20, e.g., for use with battery modules 12 having fewer battery cells 24 than those which are shown in FIG. 1. In this case, the PCB 16 of FIG. 5 retains the general footprint shown in FIG. 1, which in turn enables a common PCB 16 to be populated with different combinations of the electronic components 20 for use in multiple configurations of the battery module 12. Also, the exact PCB 16 including the electronic components 20 can be common/the same in different configurations of the battery module 12, e.g., the PCB 16 designed to sense signals from twenty battery cells 24 may also be used for sixteen battery cells 24.

In general, the configuration shown in FIG. 5 may be made by a process in which solder paste is dispensed onto the solder landings 36 of the flex circuit 18. Alternatively, solder paste may be dispensed onto corresponding solder pads 65 and/or 66 of the PCB 16 (see FIG. 7). The PCB 16 is populated with the various components 20 shown in FIG. 2, e.g., via a pick-and-place process, and then placed and mated to the flex circuit 18, or the flex circuit 18 may be picked, placed, and mated to the PCB 16. The adhesive patches 37 depicted in FIG. 5 may be used between the PCB 16 and the flex circuit 18 for added retention, as noted above. The PCB 16 and flex circuit 18 are then soldered via a reflow process to construct the above-described PCBA 140. Thereafter, the PCBA 140 is mounted to the carrier frame 28 and subjected to a welding process to electrically connect the flying leads 22 to the busbars 30. Flying leads 22 may also be joined to the busbars 30 with the same joining process used to join the busbars 30 to the cell electrode terminals 26.

Figure 6:
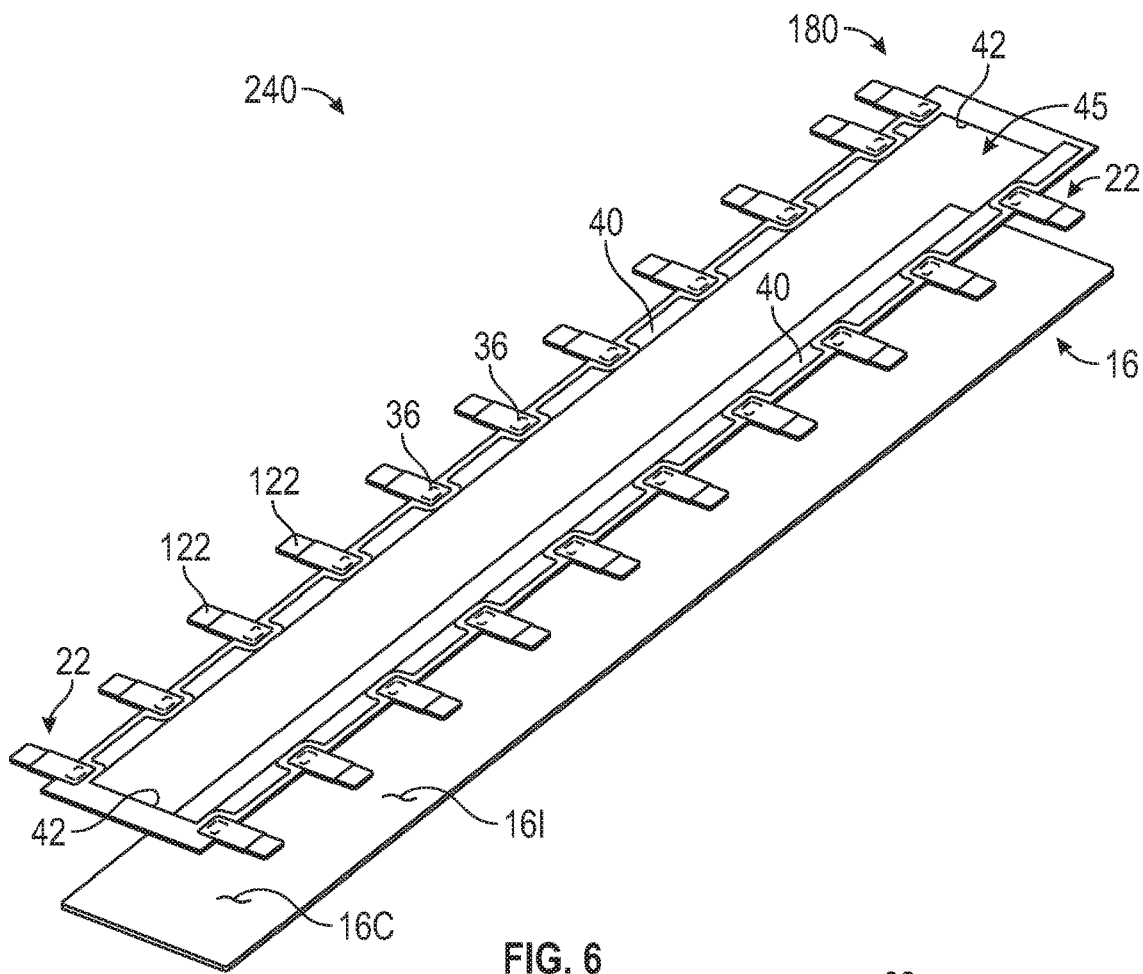

An alternative ICB assembly 240 is shown in FIG. 6. In this configuration, the above-described flex circuit 18 is replaced with an alternative flex circuit 180 in which material of the major surface 19 is removed to define the window 45 of FIGS. 11B and 11D. The window 45 is in turn defined by two perimeter side edges 40 and opposing end edges 42. Such an embodiment enables a single-sided design in which the component surface 16C is positioned adjacent to the flex circuit 18, with the components 20 protruding through the window 45, thus enabling different build configurations relative to the embodiment of FIG. 5. Thus, the interface surface 161 and the component surface 16C may be the same surface in some embodiments.

Figure 7:
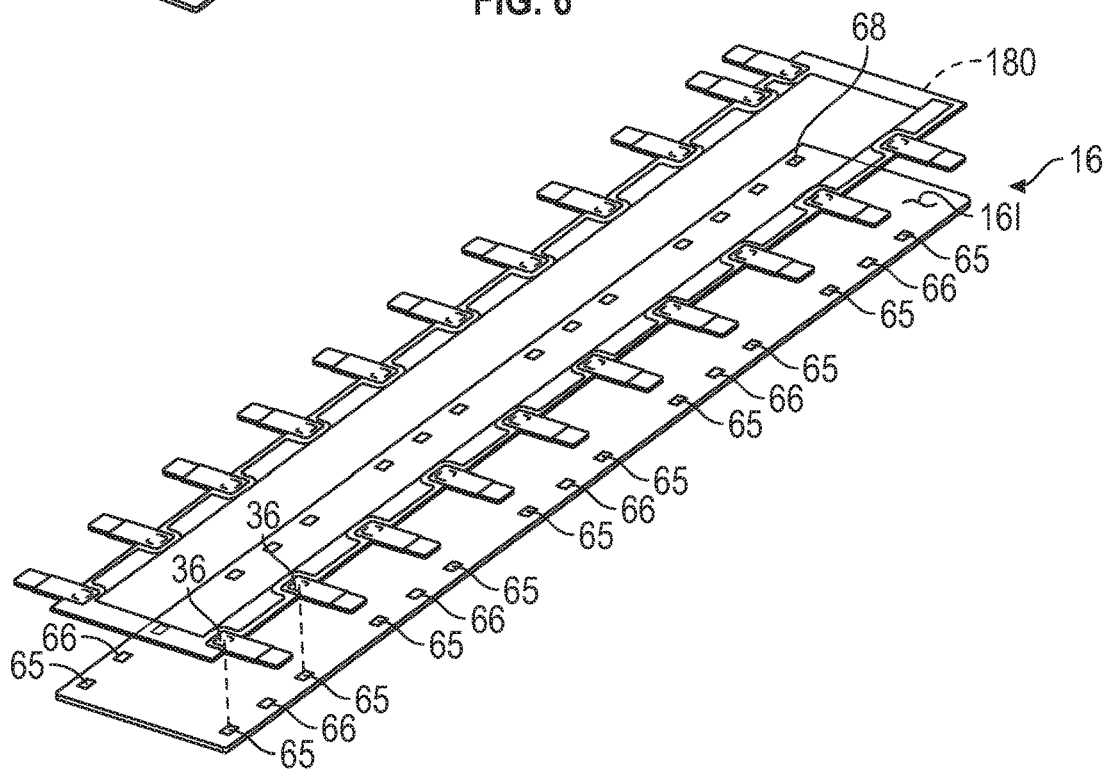

As shown in FIG. 7, the periphery of the PCB 16 may be optionally equipped with a plurality of solder lands 65. The spacing between and number of the solder lands 65 and/or 66 may vary depending on the configuration of the battery module 12 of FIG. 1. For instance, in an embodiment in which the PCB 16 is used with a battery module 12 having twenty battery cells 24 with each cell 24 electrically in series, twenty-one spaced solder pads 65 may be arranged around the periphery of the PCB 16. If the PCB 16 is used with a different battery module 12, e.g., one having twenty battery cells 24, with ten groups of two cells 24 electrically in parallel, eleven spaced solder pads 66 may be used around the periphery of the PCB 16.

Also as shown in FIG. 7, the PCB 16 may contain both solder lands 65 and 66, such that the same footprint and/or population of the electronic components 20 on the PCB 16 can be used for both the twenty cell 24 group and the ten cell group 24 configurations of the battery module 12. The flex circuit 18 may contain solder landings 36 corresponding to either pads 65 or 66, or solder landings 36 corresponding to both pads 65 and 66, in which case the solder pads 65 may be electrically connected to the flying leads 22 and solder pads 66 may be mechanically soldered but electrically unconnected, i.e., for aiding mechanical retention of the flex circuit 18 to the PCB 16.

An optional common/shared solder land 68 may be used in certain embodiments, with the solder land 68 being "common" or "shared" in the sense of its use in both of the example battery modules 12. The distance or pitch between adjacent solder pads 65 or 66 corresponds to the spacing or pitch between the busbars 30, which in turn is set by the configuration and spacing of the battery cells 24 of FIG. 1. Therefore, the number and spacing of solder pads 65 or 66 may vary with the intended application.

Figure 8:
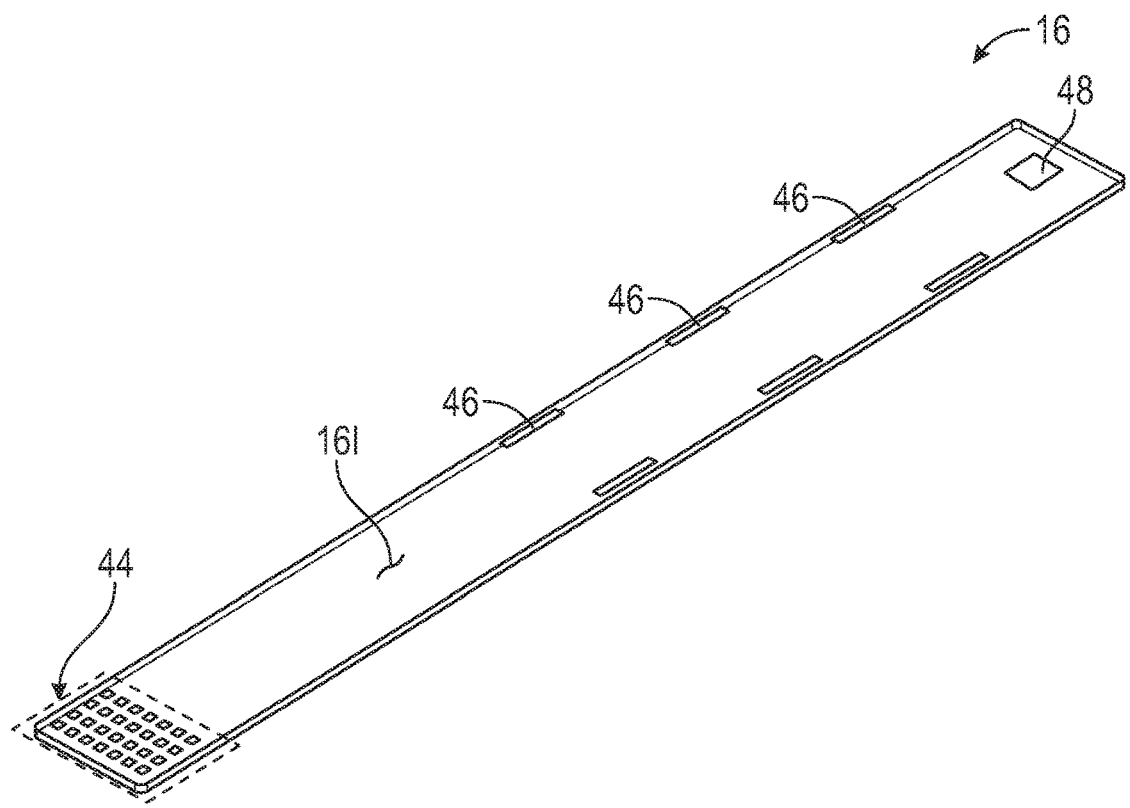
FIGS. 8 and 9 are schematic perspective view illustrations of a surface of the PCB shown in FIG. 1 according to two possible embodiments.

Referring to FIG. 8, other surface treatments of the PCB 16 may be used to achieve various performance advantages. For instance, a flip-chip or ball grid array (BGA)-approach may incorporate a BGA matrix 44 of both electrically functional and dummy mechanical solder connections. Elsewhere on the PCB 16, additional dummy solder connections 46 and 48 may be disposed around the periphery of the PCB 16. The BGA matrix 44 and the dummy solder connections 46 and 48 may be used to help increase the overall rigidity and structural integrity of the PCBA 140 and its various embodiments, as opposed to forming functional electrical connections.

Figure 9:
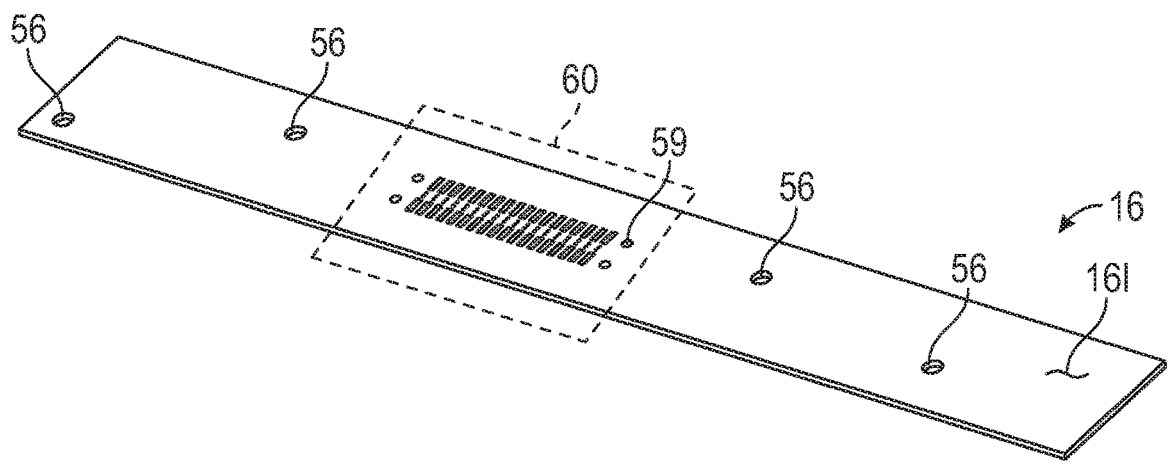

An alternative embodiment shown in FIG. 9 includes through-holes 56 formed in the PCB 16, e.g., for use with fasteners or snap-fit connectors to attach the PCB 16/PCBA 140 to the carrier frame 28 of FIGS. 1, 3, and 4. Additionally, solder pads 60 may be present on the flex interface surface 161 to facilitate a hot bar or reflow process, or the use of electrically conductive adhesive film or paste. Unlike FIG. 7 in which the solder pads 65 and/or 66 are distributed on the periphery, the solder pads 60 of FIG. 8 are disposed locally with smaller pitch/spacing, e.g., typically less than about 3 mm. The solder pads 60 enable the same benefits as the aforementioned embodiment in FIG. 7, e.g., the PCB 16 can remain common in footprint and/or in the population of electronic component 20 between different configurations of the battery module 12. Smaller holes 59 in the PCB 16, located on either side of the solder pads 60, may serve as fiduciary/alignment holes to help align mating parts during the bonding process. Such holes 56 and 59 may be present in the various disclosed embodiments as will be appreciated by one of ordinary skill in the art.

The ICB assembly 14 in its different embodiments as described above is thus tailored to optimize packaging size and manufacturing efficiency. One manner in which these and other objectives may be achieved is the use of a predominantly aluminum flex circuit 18 in combination with other electrical integration processes and distributed cell monitoring. The ICB assembly 14 is low profile relative to approaches using external connector-terminated flexible printed circuit or a discrete wiring harness. Additionally, the ICB assembly 14 may enable commonality of hardware across different embodiments of the battery module 12 as noted above, while at the same time increasing the percentage of surface area on the component surface(s) 16C available for population by the electronic components 20. When the disclosed structural features of the ICB assembly 14 are used in conjunction with wireless/RF transmission between the ICB assembly 14 and the BSM 50 of FIG. 1, the required packaging space for the ICB assembly 14 may enjoy an even lower profile. These and other possible benefits will be readily appreciated by those of ordinary skill in the art in view of the foregoing disclosure.

While the best modes for carrying out the disclosure have been described in detail, those familiar with the art to which this disclosure relates will recognize various alternative designs and embodiments lying within the scope of the appended claims. It is intended that matter contained in the above description and/or shown in the accompanying drawings, unless otherwise noted, shall be interpreted as illustrative and not limiting.

What I claim is:

1. An interconnect board (ICB) assembly for use with a battery module having a plurality of battery cells and a battery controller, comprising:
    a printed circuit board assembly (PCBA) in communication with the battery controller, the PCBA including:
        a printed circuit board (PCB) having a component surface populated with electronic components which collectively measure and report parameters of the battery module to the battery controller; and
        a flex circuit, integrally formed with the PCB such that the flex circuit and the PCB are formed as a unitary component, and constructed of a conductive foil coated with an insulating material, wherein the flex circuit defines a plurality of tabular flying leads that radially-project from a periphery of the flex circuit; and
    a carrier frame having a support surface flanked by a plurality of conductive busbars, wherein the PCBA is seated on the support surface, and wherein each respective one of the flying leads is conductively joined to a corresponding one of the busbars, and wherein the busbars are configured to be conductively joined to a respective one of the battery cells.

2. The ICB assembly of claim 1, wherein the conductive foil is aluminum foil.

3. The ICB assembly of claim 2, wherein the support surface and the PCBA are rectangular, and wherein the plurality of tabular flying leads project from elongated side edges of the flex circuit.

4. The ICB assembly of claim 2, wherein the flex circuit includes a plurality of discrete landings of a solderable material deposited or plated onto a corresponding junction between each respective one of the flying leads and a major surface of the flex circuit.

5. The ICB assembly of claim 4, wherein the solderable material is constructed substantially of copper.

6. The ICB assembly of claim 1, wherein the flex circuit defines a window through which the electronic components protrude.

7. The ICB assembly of claim 1, further comprising potting or over-molding material that encapsulates the component surface and the electronic components populating the component surface.

8. The ICB assembly of claim 1, wherein the flex circuit has elongated side edges, and the flying leads are tabs extending from and distributed over at least one of the elongated side edges.

9. A battery system comprising:
    a battery controller; and
    a battery module having a plurality of battery cells and an interconnect board (ICB) assembly, the ICB assembly comprising:
        a printed circuit board assembly (PCBA) in communication with the battery controller, the PCBA including:

a printed circuit board (PCB) having a component surface populated with electronic components which collectively measure and report parameters of the battery module to the battery controller; and a flex circuit, integrally formed with the PCB such that the flex circuit and the PCB are formed as a unitary component, and constructed of a conductive foil coated with an insulating material, wherein the flex circuit defines a plurality of tabular flying leads that radially-project from a periphery of the flex circuit; and a carrier frame having a support surface flanked by a plurality of conductive busbars, wherein the PCBA is seated on the support surface, and wherein each respective one of the flying leads is conductively joined to a corresponding one of the busbars, and each of the busbars is conductively joined to a respective one of the battery cells.

10. The battery system of claim 9, wherein the battery controller and the ICB assembly have respective radio frequency transceivers that communicate with each other over a wireless communications pathway.

11. The battery system of claim 9, wherein the conductive foil of the flex circuit is aluminum.

12. The battery system of claim 9, wherein the support surface and the PCBA are rectangular in shape, and wherein the flying leads project from at least one elongated side edge of the flex circuit.

13. The battery system of claim 9, wherein the flex circuit includes a plurality of discrete landings of a solderable material deposited or plated onto a corresponding junction between each respective one of the flying leads and a major surface of the flex circuit.

14. The battery system of claim 9, wherein the flex circuit defines a window through which the electronic components protrude.

15. The battery system of claim 9, further comprising potting or over-molding material that encapsulates the component surface and the electronic components populating the component surface.

16. The battery system of claim 9, wherein the periphery of the PCB includes a spaced plurality of discrete solder lands.

17. A printed circuit board assembly (PCBA) for a battery module having an interconnect board (ICB) assembly that includes a plurality of aluminum busbars, the PCBA comprising:

a rectangular printed circuit board (PCB) having a flex circuit interface surface and a component surface, wherein the component surface is populated with electronic components collectively configured to measure and report parameters of the battery module to an external battery controller; and a rectangular flex circuit, integrally formed to the PCB at or along the flex circuit interface surface of the PCB such that the flex circuit and the PCB form a unitary component, wherein the flex circuit is constructed of aluminum foil on which is deposited or plated a plurality of discrete copper solder landings, and wherein the flex circuit defines a plurality of tabular flying leads that radially project from a periphery of the PCBA toward the aluminum busbars, wherein each respective flying lead of the plurality of tabular flying leads is conductively joined to a corresponding one of the busbars.

18. The PCBA of claim 17, wherein the flex circuit defines a window adjacent to the PCB, and wherein the electronic components protrude through the window.

19. The PCBA of claim 17, wherein a periphery of the PCB includes a spaced plurality of solder lands.

20. The PCBA of claim 17, wherein the electronic components include a radio frequency transceiver configured to communicate wirelessly with the external battery controller.

* * * * *